United States Patent

(12) United States Patent
Aubin

(10) Patent No.: US 8,234,321 B2
(45) Date of Patent: Jul. 31, 2012

(54) GENERATION OF A HIGH-RATE RANDOM BIT FLOW

(75) Inventor: Guy Georges Aubin, Viroflay (FR)

(73) Assignee: Centre National de la Recherche Scientifique, Paris (FR)

( * ) Notice: Subject to any disclaimer, the term of this patent is extended or adjusted under 35 U.S.C. 154(b) by 801 days.

(21) Appl. No.: 10/587,366

(22) PCT Filed: Jan. 31, 2005

(86) PCT No.: PCT/FR2005/050058
§ 371 (c)(1),
(2), (4) Date: May 28, 2008

(87) PCT Pub. No.: WO2005/078926
PCT Pub. Date: Aug. 25, 2005

(65) Prior Publication Data
US 2008/0252496 A1    Oct. 16, 2008

(30) Foreign Application Priority Data
Jan. 30, 2004    (FR) ..................... 04 50170

(51) Int. Cl.
*G06F 1/02* (2006.01)
*G06F 7/58* (2006.01)

(52) U.S. Cl. ...................... 708/250; 708/209

(58) Field of Classification Search ........... 708/250–256
See application file for complete search history.

(56) References Cited

U.S. PATENT DOCUMENTS

| 3,657,718 | A | | 4/1972 | O'Farrell | |
| 3,881,099 | A | * | 4/1975 | Ailett et al. | 708/253 |
| 4,545,024 | A | | 10/1985 | Maher et al. | |
| 5,153,532 | A | | 10/1992 | Albers et al. | |
| 6,188,714 | B1 | * | 2/2001 | Yamaguchi | 375/130 |
| 6,763,363 | B1 | * | 7/2004 | Driscoll | 708/252 |

FOREIGN PATENT DOCUMENTS

WO    WO 01/37441    5/2001

OTHER PUBLICATIONS

International Search Report dated Jun. 7, 2005.

* cited by examiner

*Primary Examiner* — Lewis A Bullock, Jr.
*Assistant Examiner* — Kevin G Hughes
(74) *Attorney, Agent, or Firm* — Howard IP Law Group, P.C.

(57) ABSTRACT

A method for accelerating a pseudo-random input bit flow ($PRBS(T_1)$), generated at a first relatively low dock frequency (f1), into an identical output bit flow ($PRBS(T_0)$) at a second relatively high dock frequency (f0), comprising: collecting the output bit flow, delaying the collected flow by a predetermined value ($\tau$); and combining the delayed flow with the input bit flow.

5 Claims, 2 Drawing Sheets

GENERATION OF A HIGH-RATE RANDOM BIT FLOW

CLAIM FOR PRIORITY

This application claims the benefit of French Application No. 04/50170, filed Jan. 30, 2004 and Intl Application No. PCT/FR2005/050058, filed Jan. 31, 2005 and is incorporated herein by reference.

BACKGROUND OF THE INVENTION

1. Field of the Invention

The present invention relates to the random generation of a bit flow. The present invention more specifically relates to the generation of a high bit-rate flow (higher than 10 giga-bits/s) and more specifically applies to high-speed transmissions over communication connections or networks of any type.

2. Discussion of the Related Art

FIG. 1 very schematically illustrates in the form of blocks a first example of application of the present invention. It is a testing of a connection 1 of communication between a transmitter 2 (Tx) and a receiver 3 (Rx). The connection may be an electrical, optical, or microwave link. Communication standards provide standardized tests of simulation of the traffic on connections. Such tests are performed by means of a specific device 4 (TEST-RNG), connected instead of transmitter 2. This test device transmits a pseudo-random bit sequence PRBS over the transmission line. In the test application, an electrical, optical, radio, opto-electric, or electro-optic device (for example, the receiver or a clock recovery unit of the connection) may also directly be tested. The pseudo-random bit sequences are determined, for example, by a standard ITQ 0.151.

FIG. 2 illustrates in a very simplified view in the form of blocks a second example of application of the present invention. The case in point is to scramble or code a transmission, or to average the signal characteristics to mask the transmitted data or to balance the traffic over a connection.

FIG. 2 shows a transmitter 2 (Tx) connected to a connection 1. Transmitter 2 comprises a digital circuit 21 (µTx) for processing data D for their transmission after possible modulation (modulator 22) on a carrier OL originating from a local oscillator, and passing through a transmit amplifier 23 (LNA). A scrambler or coder 24 is provided at the output of circuit 21 before modulation by element 22. This scrambler (SCRAMB-RNG) aims at modifying, by means of a pseudo-random bit sequence, the characteristics of the transmitted data.

The invention also applies to an optical transmission. For example, a scrambler may be interposed upstream of the electro-optic conversion, the local oscillator being a light source, for example, a laser.

Pseudo-random generations are also used in error-correction code applications, transmissions of "code division multiple-access" type (CDMA), cryptography, etc.

FIG. 3 shows a conventional example of a generator of a pseudo-random bit sequence (PRBS) of the type used in the above-mentioned applications. Such a generator is based on the use of ring-connected shift registers. Several flip-flops 30 (B1, Bi, Bn) are series-associated, that is, the Q output of flip-flop B1 is connected to the D data input of the second flip-flop, and so on until the Q output of the penultimate flip-flop is connected to input D of the n-th flip-flop. The output of the last flip-flop Bn is looped back, via an XOR-type gate 31, onto the D input of the first flip-flop. The second input of gate 31 is connected to the output of an intermediary flip-flop Bi of the series association.

The number of flip-flops depends on the power desired for the pseudo-random bit sequence, that is, the number of bits on which the probability of obtaining a 0 or a 1 is respected. The longer the sequence, the greater number n of flip-flops, the better the random character of the generated PRBS sequence. Actually, the sequence length is equal to $2^n-1$. For example, by using 7 flip-flops, a 127-bit sequence is obtained.

The selection of the position of intermediary flip-flop Bi in the series association is linked to the obtaining of an irreducible polynomial of degree n and thus depends on the number of stages. The generated bit sequences are now called "m-Sequences" and respect a linear recurrence with a primitive polynomial characteristic. Such sequences are for example described in work "Finite Field For Computer Scientists And Engineers" of Robert J. Mc Eliece published by Kluwer Academic Publishers in 1995.

A disadvantage of current PRBS electric signal generators is linked to high bit-rate applications, that is, applications at several tens of gigabits/s. The forming of logic circuits and especially of fast flip-flops requires particularly expensive technologies. In practice, beyond from 10 to 20 gigabits/s, multiplexers having a number of inputs (and thus a complexity) linked to the desired acceleration factor must be used to mix phase-shifted signals according to an ETDM technique (Electrical Time Division Multiplexing). This solution further requires generating, in parallel, all the phase-shifted signals.

In an optical implementation, there now exists no equipment enabling achieving rates greater than 48 gigabits per second, unless multiplexers of OTDM type (Optical Time Division Multiplexing) in a number linked to the desired acceleration factor are used.

SUMMARY OF THE INVENTION

The present invention aims at providing a novel technique for generating random bit trains which enables achieving high bit rates. According to a first aspect, the present invention aims at decreasing the number of electronic elements used for the flow generation. The present invention especially aims at enabling decrease in the number of fast components of a shift register generator, or the use of a simple two-input multiplexer.

The present invention also aims at providing a solution which is compatible with an electronic and/or optical generation.

Document U.S. Pat. No. 4,545,024 describes a random number generator in which a delayed output bit flow is combined with an input bit flow. The two flows are not identical. The frequency of the output flow is lower than or equal to that of the input flow. Further, this document excludes the use of a pseudo-random bit flow.

To achieve these and other objects, the present invention provides a method for accelerating a pseudo-random input bit flow, generated at a first relatively low clock frequency, into an identical output bit flow at a second relatively high clock frequency, comprising the steps of:

collecting the output bit flow;

delaying the collected flow by a predetermined value ($\tau$); and combining the delayed flow with the input bit flow.

According to an embodiment of the present invention, delay $\tau$ is selected to respect the following relation:

$$\tau = 2^i T_1 - T_0,$$

where $T_1$ represents the clock period of the input bit flow, $T_0$ represents the clock period of the output bit flow, and l is an integer setting a decimation parameter.

According to an embodiment of the present invention, delay τ is selected to respect the following relation:

$$\tau = (2k+1)*(2^n-1)*T_0,$$

where k represents any integer, and where n represents the degree of the irreducible polynomial of the random sequence.

According to an embodiment of the present invention, numbers k and l respect the following relation:

$$(2k+1)*(2^n-1)+1=p2^l,$$

where p is the desired acceleration factor.

The present invention also provides a circuit for accelerating an initial bit flow generated at a first relatively low frequency, into an identical accelerated bit flow at a second relatively high frequency, comprising a combiner having a first input receiving the initial bit flow and having an output providing the accelerated flow, a second input of the combiner being connected by a delay element to the combiner output.

According to an embodiment of the present invention, a reshaping element at the high frequency is provided at the combiner output.

According to an embodiment of the present invention, a phase-shifting element is further provided between the generator of the original pseudo-random bit sequence and the combiner.

According to an embodiment of the present invention, the initial bit flow is obtained by a flip-flop generator.

According to an embodiment of the present invention, the circuit is formed by optical and/or electronic means.

BRIEF DESCRIPTION OF THE DRAWINGS

The foregoing objects, features, and advantages of the present invention, as well as others, will be discussed in detail in the following non-limiting description of specific embodiments in connection with the accompanying drawings, in which.

DETAILED DESCRIPTION

Figure 1:
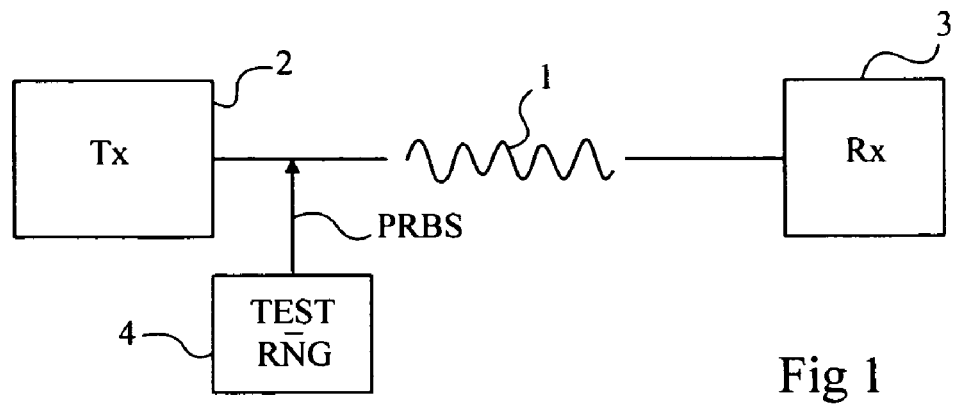
FIGS. 1 to 3, previously described, are intended to show the state of the art and the problem to solve.
Figure 2:
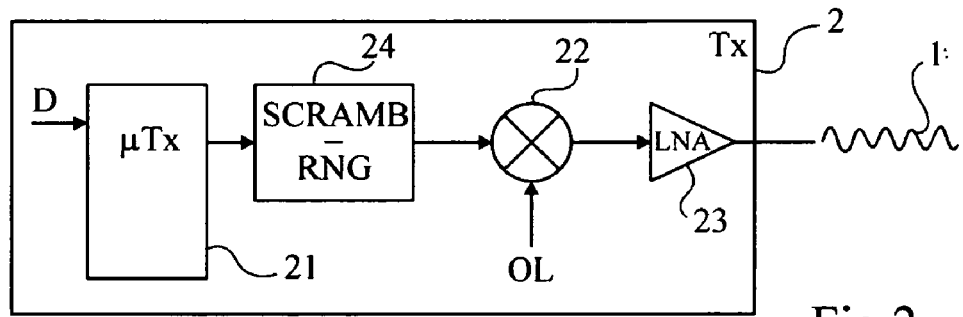
Figure 3:
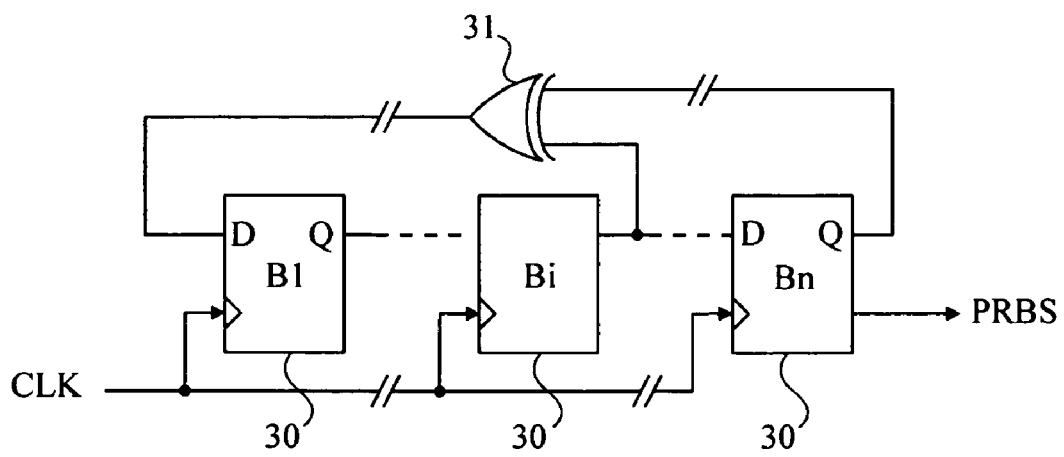

The same elements have been designated with the same reference numerals in the different drawings. For clarity, only those elements which are necessary to the understanding of the present invention have been shown in the drawings and will be described hereafter. In particular, the practical forming of electronic circuits exploited by the present invention has not been detailed when devices known per se have to be formed. Further, although the present invention will be described hereafter in relation with an application to electronic devices, it also applies to optical, electro-optic, or optoelectronic devices.

A feature of the present invention is to generate a pseudo-random bit flow at a first clock frequency lower than the desired clock frequency, and to combine this initial flow with the output flow delayed by a desired quantity, to obtain at the output a flow at the higher frequency.

The delay selected to recombine the output bit flow with the low-rate generated bit flow is selected to correspond to the total length of the aimed frequency ($2^n-1$) multiplied by the high-rate clock period and by any odd integer. In other words, noting τ the delay introduced by the line delaying the outgoing bit flow before combination with the incoming bit flow, n the degree of the irreducible polynomial corresponding to the aimed random sequence, $T_0$ the high-rate clock period, and $T_1$ the incoming low-rate clock period, delay τ is selected to respect the following formula:

$$\tau = (2k+1)*(2^n-1)*T_0,$$

where k represents any integer, and where ($2^n-1$) corresponds to the number of bits of the random sequence.

Figure 4:
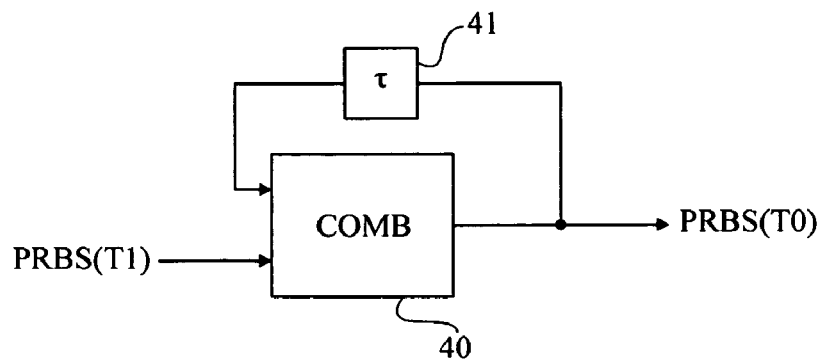
FIG. 4 very schematically shows in the form of blocks an embodiment of a device for increasing the rate of a random bit flow according to the present invention.

FIG. 4 very schematically illustrates in the form of blocks an embodiment of an acceleration circuit according to the present invention. Such a circuit exploits at its input a random bit flow PRBS($T_1$) at a first relatively low frequency, and is in charge of providing a pseudo-random bit flow PRBS($T_0$) at a relatively high frequency. The acceleration factor will be designated hereafter as p (p=$T_1/T_0$). A combiner 40 (COMB) receives at its input the low-frequency flow and the output bit flow after it has crossed a delay line 41 of value τ.

The present invention takes advantage from the fact that it is possible to generate a flow at a relatively low rate and to combine this flow with the same flow delayed by an adequate period to obtain a pseudo-random bit train of higher rate. It is thus possible to use a generator of lower rate, which is thus less expensive, to obtain the initial flow PRBS($T_1$).

The only element which must operate at high speed according to the present invention is combiner 40 (and the possible downstream elements).

The present invention may be implemented by a logic gate circuit at the condition that the duty cycle of the input bit train pulse is selected so that the duration of a high state is shorter than or equal to the duration of a bit of the output flow, that is, period $T_0$. In fact, if this high state duration is shorter than the previously-mentioned condition, an RZ-type output can be generated, that is, with a return-to-zero. If the high state duration (width) is equal to the final bit time, the output is of NRZ type, that is, with no return to zero.

Figure 5:
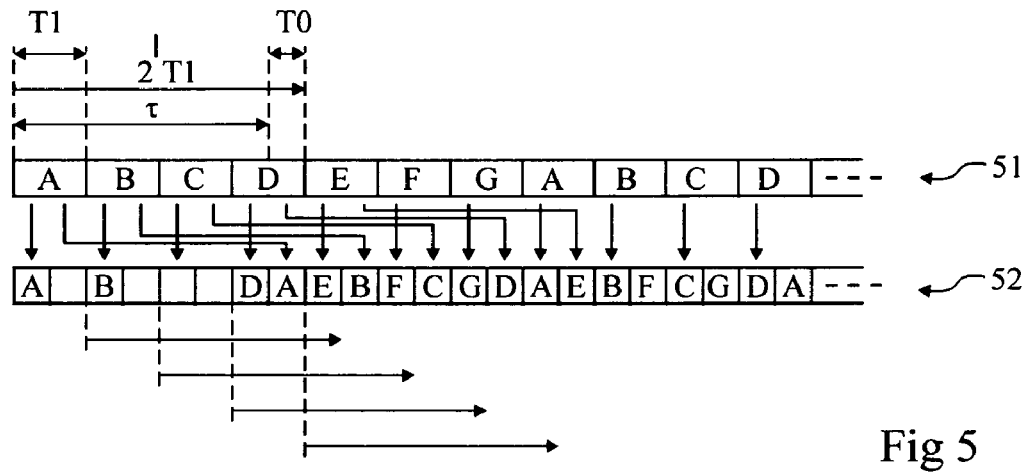
FIG. 5 illustrates the operation of a rate-increasing device according to the present invention.

FIG. 5 illustrates the operation of an accelerator according to the present invention. This drawing shows, in the form of timing diagrams, an initial bit flow 51 and a final bit flow 52 after application of the acceleration method of the present invention. An initial flow A, B, C, D, E, F, and G of length $2^n-1=7$ bits an of irreducible polynomial $x^3+x+1$ of degree n=3 is here assumed. The delay introduced by line 41 is selected to correspond to $2^l T_1-T_0$ with l=2.

Parameter l is linked to the acceleration factor (p) by the following relation:

$(2k+1)*(2^n-1)+1=p2^l$, and determines the selected decimation parameter ($2^l$). Reference may be made to Robert J. Mc Eliece's above-mentioned work for the selection of this parameter.

It can be seen that at the end of a time period corresponding to delay τ, random bit flow 52 present at the accelerator output corresponds to a flow having a frequency which is double the frequency of initial flow 51.

Further, the flow is identical, that is, the output sequence is equal to the input sequence. For example, assuming that input sequence <ABCDEFG> is equal to <1110100>, it can be seen that output sequence <AEBFCGD> is effectively equal to <1110100>.

The example of FIG. 5 has been taken in simplified fashion for a frequency doubling. It should however be noted that number p may be selected to give a bit flow having a period multiple greater than two with respect to the initial flow. The only condition to be fulfilled is that delay τ corresponds to an integral multiple of period $T_0$, that is, to a value $2^pT_1-T_0$, to obtain an output sequence identical to the input sequence (except for the rate), and having high state pulses of a duration shorter than or equal to $T_0$.

Figure 6:
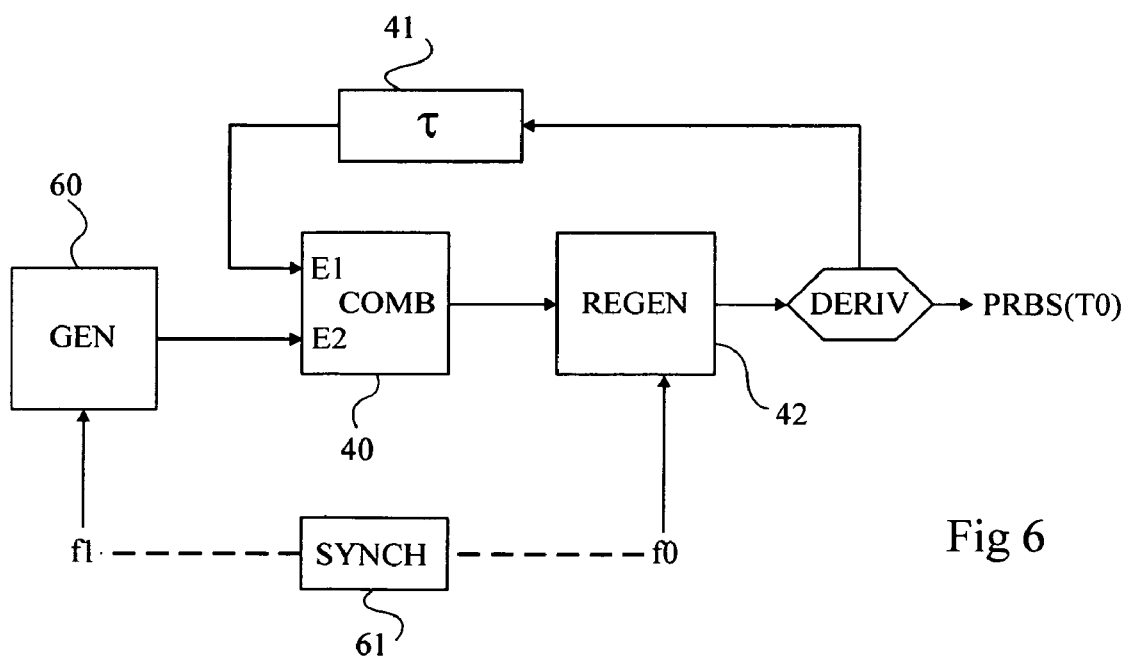
FIG. 6 very schematically illustrates in the form of blocks an embodiment of a high-speed generator according to the present invention.

FIG. 6 illustrates an embodiment of an accelerator according to the present invention, associated with a pseudo-random flow generator.

Generator 60 is a generator of modulated pulses at a relatively low rate controlled by a clock signal of frequency f1. The output of this generator is sent onto an input E2 of a combiner 40 (COMB) having its other input receiving the output of delay line 41 bringing a delay τ to a signal that it collects on output flow PRBS($T_0$). Flow PRBS($T_0$) may be provided in practice by a regeneration circuit 42 (REGEN) in charge of shaping, at frequency f0>f1, the output of combiner 40. Of course, frequencies f1 and f0 are synchronized (for example, by means of a circuit 61 (SYNCH)).

According to another embodiment, a two-input multiplexer is used as a combiner (40). The low-rate input signal PRBS($T_1$) is then applied on the selection input of the multiplexer while its two data inputs respectively receive the output of the delay line (41) and a constant high level.

It should be noted that unlike conventional ETDM or OTDM techniques which use delayed replicas of an input signal, the present invention forms a recirculation loop in which the delay is applied to a signal collected at the output.

In practice, inputs E1 and E2 of the combiner must receive signals in phase. For example, an element of phase-shifter type (preferably adjustable) is provided between generator 60 (or integrated to the latter) and combiner 40 to phase the signals applied to inputs E1 and E2.

The foregoing description has been made in relation with an electronic circuit implementation. It should however be noted that a completely or partially optical implementation of the present invention is possible. For example, an optical source of a few gigabits/s, or even a few tens of gigabits/s, which is submitted to an accelerator according to the present invention may be used. Such an accelerator may be obtained by separating the initial bit flow with a separator, one of the paths being assigned a selected delay, as for the electronic version.

Of course, the present invention is likely to have various alterations, modifications, and improvements which will readily occur to those skilled in the art. In particular, the practical forming of a delay line for implementing the present invention, be it by electronic or optical technologies, is within the abilities of those skilled in the art based on the functional indications given hereabove. For example, optical and/or electronic techniques may be used within the accelerator circuit (electrically-controlled optical modulator, photodiode associated with a laser, etc.). Further, the exploitation of the high bit-rate flows generated by the present invention is compatible with all conventional applications.

The invention claimed is:

1. A circuit for accelerating an initial pseudo-random bit flow having a length of $2^{n-1}$ bits generated from a polynomial of an irreducible degree n at a first frequency, into an identical accelerated bit flow at a second frequency greater than the first clock frequency, the circuit comprising a combiner having a first input adapted to receive the initial bit flow and having an output adapted to provide the accelerated flow, a second input of the combiner being connected by a delay element to the combiner output, the delay τ of the delay element respecting the following relation:

$$\tau=((2^l)*T_1)-T_0,$$

wherein $T_1$ represents the clock period of the input bit flow, $T_0$ represents the clock period of the output bit flow, and l is a non-zero integer setting a decimation parameter, wherein delay τ is also selected to respect the following relation:

$$\tau=(2k+1)*(2^n-1)*T_0,$$

where k represents any non-zero integer, and where n represents the degree of the irreducible polynomial of the random sequence.

2. The circuit of claim 1, further comprising a regeneration circuit configured to shape at the second frequency the output of the combiner.

3. The circuit of claim 1, wherein a phase-shifting element is further provided between the generator of the original pseudo-random bit sequence and the combiner.

4. The circuit of claim 1, wherein the initial bit flow is obtained by a flip-flop generator.

5. The circuit of claim 1, formed by at least one of optical and electronic means.

* * * * *